United States Patent
Sridharan et al.

(10) Patent No.: US 9,205,505 B2
(45) Date of Patent: Dec. 8, 2015

(54) HERMETICALLY SEALED ELECTRONIC DEVICE USING SOLDER BONDING

(75) Inventors: Srinivasan Sridharan, Strongsville, OH (US); Robert P. Blonski, North Royalton, OH (US); Chandrashekhar Khadilkar, Broadview Heights, OH (US); John J. Maloney, Solon, OH (US)

(73) Assignee: Ferro Corporation, Mayfield Heights, OH (US)

( * ) Notice: Subject to any disclaimer, the term of this patent is extended or adjusted under 35 U.S.C. 154(b) by 360 days.

(21) Appl. No.: 13/808,571

(22) PCT Filed: Jul. 22, 2011

(86) PCT No.: PCT/US2011/045050
§ 371 (c)(1),
(2), (4) Date: Apr. 18, 2013

(87) PCT Pub. No.: WO2012/012745
PCT Pub. Date: Jan. 26, 2012

(65) Prior Publication Data
US 2013/0206230 A1     Aug. 15, 2013

Related U.S. Application Data

(60) Provisional application No. 61/366,578, filed on Jul. 22, 2010.

(51) Int. Cl.
| | |
|---|---|
| B23K 31/02 | (2006.01) |
| B23K 1/19 | (2006.01) |
| H01L 23/10 | (2006.01) |
| H01L 31/048 | (2014.01) |
| H01L 31/18 | (2006.01) |

(Continued)

(52) U.S. Cl.
CPC .............. *B23K 1/19* (2013.01); *B23K 1/0016* (2013.01); *B23K 31/02* (2013.01); *H01L 23/10* (2013.01); *H01L 31/048* (2013.01); *H01L 31/0488* (2013.01); *H01L 31/18* (2013.01); *H05K 13/00* (2013.01); *H01G 9/2077* (2013.01); *H01L 51/5246* (2013.01); *H01L 2924/0002* (2013.01); *H01L 2924/09701* (2013.01); *H01L 2924/12044* (2013.01); *Y02E 10/50* (2013.01); *Y10T 156/10* (2015.01); *Y10T 156/1062* (2015.01)

(58) Field of Classification Search
None
See application file for complete search history.

(56) References Cited

U.S. PATENT DOCUMENTS 4,106,860 A * 8/1978 Kaufmann .............. 349/154
5,733,382 A   3/1998 Hanoka
(Continued)

FOREIGN PATENT DOCUMENTS

| WO | 2012/012675 A1 | 1/2012 |
| WO | 2013/039940 A1 | 3/2013 |
| WO | 2013/067081 A1 | 5/2013 |

OTHER PUBLICATIONS

International Search Report for corresponding PCT/US2011/045050 mailed Nov. 18, 2011, two pages.

(Continued)

*Primary Examiner* — Kiley Stoner
(74) *Attorney, Agent, or Firm* — Rankin, Hill & Clark LLP

(57) ABSTRACT

Solder can be used to wet and bind glass substrates together to ensure a hermetic seal that superior (less penetrable) than conventional polymeric (thermoplastic or thermoplastic elastomer) seals in electric and electronic applications.

19 Claims, 3 Drawing Sheets

(51) Int. Cl.
  *H05K 13/00* (2006.01)
  *B23K 1/00* (2006.01)
  *H01G 9/20* (2006.01)
  *H01L 51/52* (2006.01)

(56) References Cited

U.S. PATENT DOCUMENTS

| | | | |
|---|---|---|---|
| 6,323,056 B1 * | 11/2001 | Miyoshi | 438/80 |
| 6,659,329 B1 | 12/2003 | Hall | |
| 6,706,316 B2 | 3/2004 | Ghosh et al. | |
| 7,081,178 B2 * | 7/2006 | Collins | 156/99 |
| 7,202,602 B2 | 4/2007 | Anandan | |
| 7,737,356 B2 * | 6/2010 | Goldstein | 136/251 |
| 8,378,370 B2 * | 2/2013 | Yang | 257/98 |
| 8,586,861 B2 * | 11/2013 | Goldstein | 136/251 |
| 2003/0010378 A1 * | 1/2003 | Yoda et al. | 136/251 |
| 2006/0139757 A1 | 6/2006 | Harris et al. | |
| 2007/0037058 A1 | 2/2007 | Visco et al. | |
| 2007/0170860 A1 * | 7/2007 | Choi et al. | 313/512 |
| 2007/0216300 A1 | 9/2007 | Lee et al. | |
| 2008/0120946 A1 | 5/2008 | Bayne et al. | |
| 2008/0166570 A1 * | 7/2008 | Cooper | 428/426 |
| 2009/0032924 A1 | 2/2009 | Stark | |
| 2009/0173385 A1 * | 7/2009 | Kost et al. | 136/259 |
| 2009/0214796 A1 | 8/2009 | Okaniwa et al. | |
| 2009/0218253 A1 | 9/2009 | Nguyen et al. | |
| 2011/0036494 A1 * | 2/2011 | Keenihan et al. | 156/285 |
| 2011/0115094 A1 * | 5/2011 | Darnon et al. | 257/774 |
| 2011/0303287 A1 * | 12/2011 | Lee et al. | 136/259 |
| 2012/0103401 A1 * | 5/2012 | Kitamura et al. | 136/251 |
| 2012/0202030 A1 * | 8/2012 | Kondo et al. | 428/215 |
| 2013/0112249 A1 * | 5/2013 | Kim et al. | 136/252 |
| 2013/0284266 A1 * | 10/2013 | Takeda et al. | 136/259 |
| 2014/0137940 A1 * | 5/2014 | Endo et al. | 136/259 |
| 2014/0184062 A1 * | 7/2014 | Kolodin | 315/32 |
| 2014/0261680 A1 * | 9/2014 | Han | 136/256 |
| 2014/0261684 A1 * | 9/2014 | Shinohara et al. | 136/259 |
| 2014/0283900 A1 * | 9/2014 | Umemoto et al. | 136/251 |
| 2014/0322458 A1 * | 10/2014 | Liu et al. | 428/1.62 |
| 2015/0020870 A1 * | 1/2015 | Agatsuma et al. | 136/251 |

OTHER PUBLICATIONS

Lead-free Electronics, 2004 Edition, Table 2.2: Advantages and disadvantages of key lead-free alloys, pp. 56-63.

* cited by examiner

HERMETICALLY SEALED ELECTRONIC DEVICE USING SOLDER BONDING

BACKGROUND OF THE INVENTION

1. Field of Invention

The present invention relates to a solder- or metal-based hermetic sealing system for glass plates useful in solar cells based on silicon, organic systems, and thin layer solar cells as well as other electronic devices such as organic LEDs (OLED).

2. Description of Related Art

Conventional formation of hermetic seals involves printing and firing a paste composition including a glass frit and organic solvent/binder system. Drawbacks of such systems include the need to fire at extremely high temperatures, e.g., 800° C., and the problem of entrapment of organic residue and incomplete burnout of the binder system (such as ethyl cellulose) within the hermetic seal. Such entrapment causes undesired contamination of active layers sealed within the hermetic seal, such as solar cells or OLEDs.

Accordingly, improvements in the art of hermetic sealing are required.

BRIEF SUMMARY OF THE INVENTION

The present invention provides materials, seal designs, geometries and process steps for making hermetic seals, and simplifying the manufacture of hermetic seals which are used to protect active layers of electronic devices such as solar cells, LEDs, OLEDs, plasma display panels and the like.

A variety of substrates including those made of glass, metal, ceramic as well as those constituting active device substrates may be sealed together by the materials and processes of this invention to create a hermetic seal in devices such as display devices (flat panel screens, LED screens, LCD screens, plasma display panels), organic light emitting diodes (OLEDs), solar cells and solar cell panels, and even windows for both architectural and automotive applications.

Solder can be used to wet and bind glass substrates together to ensure a hermetic seal that is superior (less penetrable) than conventional polymeric (thermoplastic or thermoplastic elastomer) seals. Soldered seals allow for a much wider working temperature range while maintaining improved resistance to ambient conditions such as wind, rain, physical abrasion and degradation due to freeze-thaw cycles or other temperature extremes. High and low temperatures in the desert can swing from e.g., −20° C. to +80° C. in a matter of a few hours. Solders can plastically flow to relieve thermal expansion mismatch stresses, which reduces or eliminates cracking of substrates and/or separation of solder seals from the substrates. Solder seals are not susceptible to ultraviolet (i.e., sunlight) degradation and weakening as a polymeric seal would be. Solder can be subjected to an ultrasonic horn, magnetic induction heating or eddy currents to effectuate binding.

DETAILED DESCRIPTION OF THE INVENTION

The inventors herein have discovered that binding two glass plates by ultrasonically activating a low-melting solder between the glass plates can result in a hermetic seal. With proper choice of a glass frit dispersed in the solder and proper choice of glass compositions of the substrates and feedthrough(s), the TCEs can be matched.

A variety of seal geometries are possible. For example, a seal may be formed between a bottom glass substrate, a preformed edge of a top glass substrate and along side the ends of an active layer (such as an OLED) and plastic (EVA or other film) layer as shown in FIG. 1.

Figure 1:
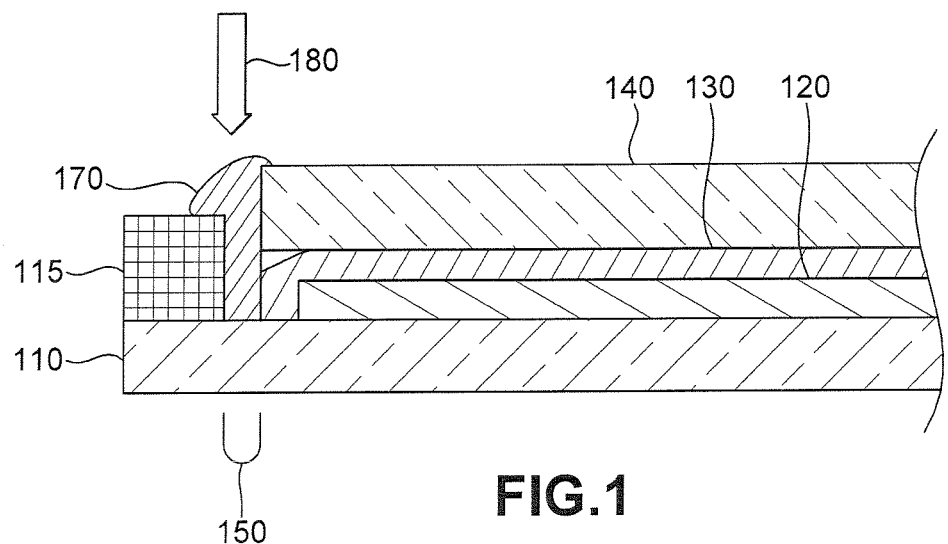
FIG. 1 schematically depicts a generalized hermetically sealed electronic device of the invention.

In FIG. 1, a schematic depiction of a portion of a generalized hermetically sealed PV device is shown. Therein a bottom glass substrate 110 includes an integral preformed edge 115, which may be added by melting or firing a substrate material to bottom glass substrate 110 or may be formed by properly cutting and shaping a sufficiently thick block of substrate material (such as glass) to become preformed edge 115 integral with bottom glass substrate 110. Alternately, seal material may be printed or otherwise applied to bottom glass substrate 110 and then fired to sinter to form integral preformed edge 115. The firing may be undertaken during a tempering cycle, such as a glass tempering cycle.

In that regard, the substrates may be the same or different, and may be chosen from among glass, coated glass, ceramic, or metal. The substrates may be coated with one or more coatings such as conductive coated glass, indium tin oxide, aluminum doped zinc oxide, metallic oxides, antireflective coatings, $SiN_x$ coatings, $Si_3N_4$ coatings, and combinations thereof.

One example would be glass substrates coated with conductive oxides. Another example would be to provide a coating (metallized bonding layer) on the substrate (such as glass) effected by sputtering, CVD, or reduced from metallic salts to give metal or metallic oxides on the surface of the glass.

Onto the bottom glass substrate 110 an active layer 120 may be positioned. It is the active layer 120 that is ultimately protected by the hermetic seal of the invention. Next, a polymer film 130 is laminated to at least one of the active layer 120 and the top glass substrate 140. The top glass substrate 140 is placed in close contact with the active layer 120.

A gap 150 between preformed edge 115 and the edges of active layer 120, polymer film 130 and top glass substrate 140 is left to allow a seal material to be filled in. The seal material may be any solder material generally including one or more of Pb, Sn, Bi, In, Ag, Zn, Sb, and/or Cu. Lead-free solders are preferably used, including, but not limited to those set forth in "Lead Free Electronics," 2004 Edition, (of CALCE press, University of Maryland, College Park, Md. ISBN number: 0-9707174-7-4) Edited by Sanka Ganesan and Michael Pecht, at pages 56-62, which is incorporated by reference. Such solders include those with general formulas Sn—Ag, Sn—Ag—Bi, Sn—Ag—Cu, Sn—Cu, Sn—Ag—Cu—Sb, Sn—Bi, Sn—Zn—Bi and others. It is also envisioned to use solders and brazes, comprising, transition elements such as Ti, Zr, V, Nb, Hf, Mn in a procedure known as "active metal brazing or soldering." These elements promote the wetting and bonding of solders or brazes to non metallic substrates such as glass or ceramics under proper atmospheric conditions.

The seal material may also be a thermoplastic or thermosetting polymeric material, however, the hermeticity desired may be diminished, and the benefits of the invention may not be fully realized. Similarly, the seal material may be a glass frit, such as a zinc borosilicate, or a bismuth borosilicate, for example. Glass based seals are generally rigid, which might crack under cyclic loading if not properly designed.

When the seal material is a solder or glass frit it is important to choose the material in order that it can sufficiently wet the substrates and can match thermal expansion coefficients (CTEs) with the substrates or plastically yield (for metallic solders) to minimize or eliminate the expansion mismatch stresses. Thus a metallic solder seal can be beneficial.

A localized or dispersed energy source 180 can be used to melt and flow the seal material to fully fill gap 150 thereby forming seal 170. Suitable localized energy sources include UV, visible light, broadband infrared curing or heating sources, laser, flame induction, or combinations thereof. Dispersed energy sources include thermal curing, ultrasound, natural gas burners, magnetic induction and eddy current heating sources.

Figure 2:
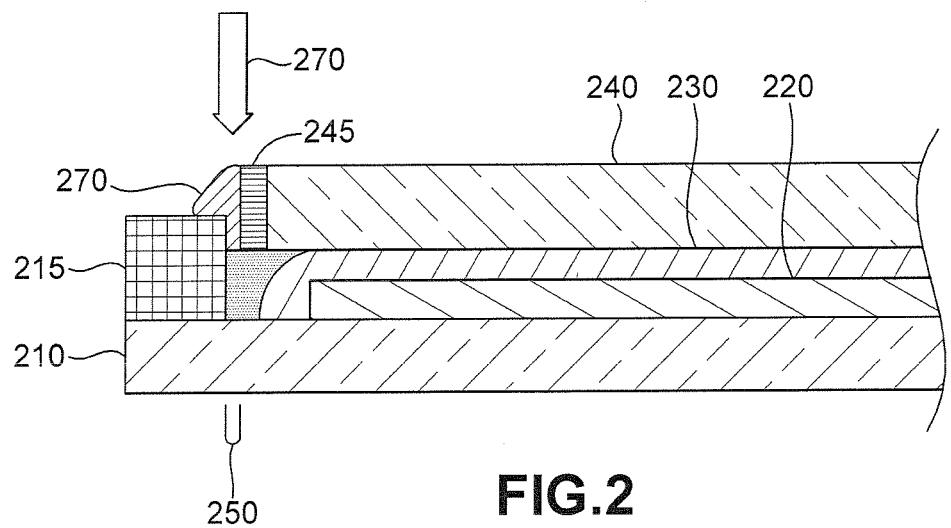
FIG. 2 schematically depicts an alternate hermetically sealed electronic device of the invention.

A second seal geometry is seen in FIG. 2, which is a variation of that depicted in FIG. 1. Reference numerals in FIG. 2 have 100 added to the reference numerals of FIG. 1 for those features in common. Bottom glass substrate 210 includes integral preformed edge 215 which may or may not be formed from a solid piece of glass as discussed with respect to FIG. 1. If not formed from a single piece of glass, then a sealing material, such as enamel, may be printed on the edge of top glass substrate 210 to form preformed edge, which may be also called frame 215. A suitable enamel is printed or otherwise applied to the edge of the bottom 210 and top 240 glass substrates. The bottom 210 and top 240 glass substrates are then fired during a tempering cycle to make edge 215 and edge band 245, respectively. A thermoplastic material such as EVA is laminated to bottom glass substrate 210 covering active layer 220 and laminated to top glass substrate 240, both when pressed together to form film layer 230. A gap 250 is left between preformed edge 215 and edgeband 245 into which a seal material such as solder and/or glass frit (both described herein) is added. Depending on the precise geometry of preformed edge 215 and edgeband 245 and active layer 220, it is possible that a gap will remain even after proper positioning of the substrates, seal and active layer and after the seal material is inserted. This will not affect the hermeticity of the seal thus formed. A seal 270 is formed by heating seal material with a localized energy source 280 which may be any disclosed herein.

Advantages of the construction and heating schemes of FIGS. 1 and 2 are at least two-fold. Because the sealing material is inorganic, there is no need to remove an organic binder as is often the case with conventional printed, dried, and fired pastes. Second, because the sealing material is heated locally, the substrate is not heated, and there is little or no problem with overheating and cracking the substrate.

Figure 3:
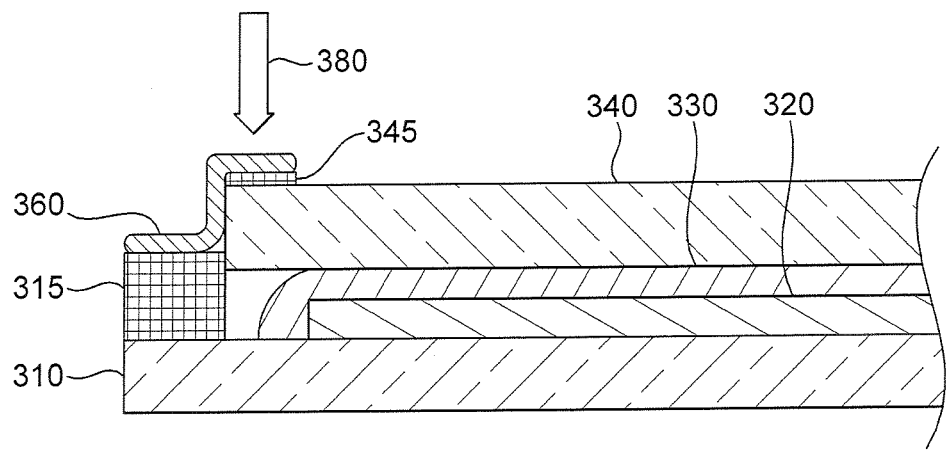
FIG. 3 schematically depicts an alternate hermetically sealed electronic device of the invention using a metal foil.

In FIG. 3, the top substrate 340 abuts the prefired edge 315, and a metal foil 360 is laid over both and sealed using a dispersed energy source such as ultrasound. In particular, bottom 310 and top 340 glass substrates can be decorated if desired and provided with prefired edge 315 and prefired edge band 345, respectively. The prefired edges provide an enamel-based surface for wetting by metal foil 360 which melts and wets upon application of dispersed energy source 380, such as an ultrasonic horn. Because edge 315 and edgeband 345 are formed of enamel that is prefired to respective substrates 310 and 340, these enamels wet the metal foil 360 which can be made of a thin sheet of a solder alloy as disclosed elsewhere herein. The metal foil can include any of a number of relatively low-melting metals such as Ag, Al, Bi, Cu, and Sn or their alloys.

Figure 4:
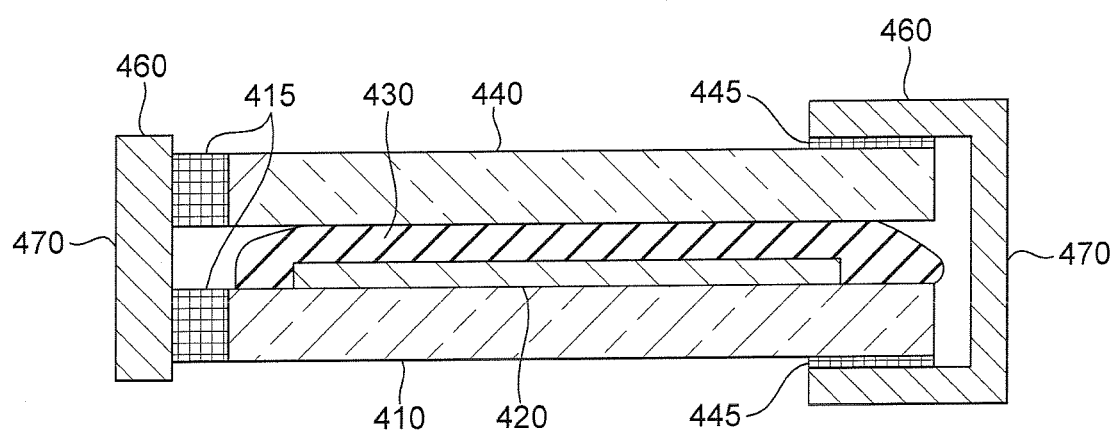
FIG. 4 schematically depicts an alternate hermetically sealed electronic device of the invention using a metal foil over the substrate ends.

In FIG. 4, an active layer is protected by a hermetic seal fashioned by applying a metal foil over the ends of the substrates and heating. In particular, bottom glass substrate 410 and top glass substrate 440 may each have edge enamel 415 applied to an edge thereof and/or surface enamel 445 applied to at least a portion of an outer surface thereof. Edge enamel 415 and surface enamel 445 are then prefired during a tempering cycle to form solid enamel edge or surface pads which are easily wet by solder. An active layer (or device) 420 is then applied to top glass substrate 410 and a polymer layer 430 is applied thereto, while bottom glass substrate 440 is placed atop the polymer layer. Metal foil 460 is positioned to cover the space between the edges of top glass substrate 410 and bottom glass substrate 440 coming into contact with edge enamel pads 415 and/or surface enamel pads 445. Either the metal foils may be heated and melted to bond with the enamel pads, or a solder material may be used to wet and bind the foil sheets to the enamel pads. In either case, a hermetic seal results.

An active layer to be protected by the seals and barriers of the invention include solar cell, solar cell contact, organic PV device, plasma display devices, nanocrystal display, electrochromic device, electrochromic material system, suspended particle device, micro-blind, liquid crystal device, smart window, switchable window, smart glass, eglass, LED, SED, FED, OLED, LCD, DLP, FLD, IMOD, TDEL, QDLED, TMOS, TPD, LCL, LPD, or OLET.

It is the active layer 120, 220, 320, 420 that is ultimately protected by the barrier, hermetic seal, gasket, or encapsulant of the invention. Products including those sold under the Sageglass® and SunValve™ product names or trademarks are envisioned as active layers or active devices useful herein.

Figure 5:
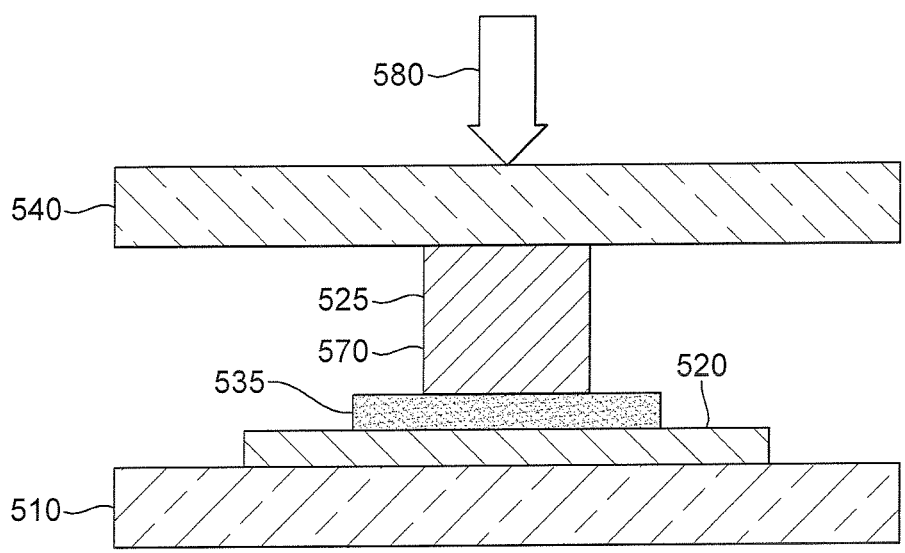
FIG. 5 schematically depicts a hermetically sealed feedthrough.

FIG. 5 depicts an embodiment of the invention, which is a process for producing a hermetically sealed feedthrough that electrically connects an inside active layer to the outside. Feedthrough 520 is positioned atop substrate 510. On top of the feedthrough an enamel layer 535 has been prefired to provide an insulation between solder seal 525 and the feedthrough 520. Onto top substrate 540 and the prefired enamel layer 535, a solder layer 525 is formed. Using pressure 580, bottom substrate 510 and top substrate 540 are pressed together such that solder layer 525 contacts the bottom substrate as well as enamel layer 535 over the feedthrough. Localized or dispersed energy is applied to melt and flow the solder layer therein forming a seal having a feedthrough.

A number variations and combinations of these design concepts in FIGS. 1 to 5 can be made and are within the scope of this invention as long as a metal solder layer or metallic foil is used as part of the bonding process.

An embodiment of the invention is a process for hermetically sealing an active layer, comprising (a) forming on a first substrate an integral preformed edge, (b) positioning on the first substrate an active layer, (c) positioning the second substrate in close contact with the active layer, leaving a gap between preformed edge and an edge of the active layer, (d) adding a seal material to the gap, and (e) applying an energy source to heat and flow the seal material to fully fill the gap thereby forming a seal therein. Between two of the steps above, such as between steps (b) and (c), a step may be added to laminate a polymer film to at least one of the active layer, the first substrate and a second glass substrate. The substrates may be glass.

The energy source can be localized and selected from the group consisting of ultrasound, visible light, ultraviolet light, broadband infrared, laser, induction, and combinations thereof. Alternately, the energy source can be dispersed, and selected from the group consisting of thermal heating, magnetic induction heating, convection furnace, and eddy currents. Other sources of electromagnetic energy can be used, when applicable having a wavelength of 250-2500 nm, alternately 500-2000 nm, alternately 750-1750 nm, alternately 750-1500 nm, however other wavelengths can be used.

Other embodiments of the invention involve localized energy deposition in order to wet and flow a sealing material such as a solder or metal foil in order to form a hermetic seal. Such metals will typically have melting points less than about 970° C., preferably less than 700° C., preferably less than 550° C., and more successively preferably less than 500° C., less than 450° C., less than 400° C. and less than 350° C. Such localized energy deposition may include induction heating, infrared heating, broadband heating, ultrasound, microwave heating as well as laser firing.

In particular, lasers and induction heating are beneficial owing to the capability of selective heating which is sufficient to fuse the metals in a solder extremely quickly, requiring as little as one millisecond ($10^{-3}$ sec).

Solder fill material may be applied to one or more substrates desired to be sealed in sublayers, which may include at least one first sublayer and at least one second sublayer. The various sublayers include different metals or combinations of metals such that, for example, the at least one first sublayer has a higher Electro-Magnetic (EM) absorbance than the at least one second sublayer. The at least one second sublayer is adjacent to a substrate and the at least one first sublayer is not adjacent to a substrate. In another embodiment, at least 30% of EM energy incident on the sublayers, preferably at least 40%, more preferably at least 50% and more preferably at least 60%, is absorbed by the at least one first sublayer. At least one of the sublayers may not absorb infrared energy. In an alternate embodiment, the absorption of incident EM energy occurs predominantly in the first sublayer or in the interface between the sublayers. In such embodiment the second sublayer does not substantially absorb EM energy, meaning it absorbs less than 20% of incident EM energy.

Preheating may be used to eliminate or reduce cracking of a glass substrate, often a problem in conventional methods of forming hermetic seals, especially with dispersed energy and/or organic binders in the seal.

Solar Cells as Active Layers. As an active layer (120, 220, 320, 420), solar cells can be fabricated into modules, and sealed together with the processes disclosed herein. Solar cells are generally made of semiconductor materials, such as silicon (Si), which convert sunlight into useful electrical energy. A solar cell contact is in generally made of thin wafers of Si in which the required PN junction is formed by diffusing phosphorus (P) from a suitable phosphorus source into a P-type Si wafer. The side of the silicon wafer on which sunlight is incident is generally coated with an anti-reflective coating (ARC) to prevent reflective loss of sunlight. This ARC increases the solar cell efficiency. A two dimensional electrode grid pattern known as a front contact makes a connection to the N-side of silicon, and a coating of predominantly aluminum (Al) makes connection to the P-side of the silicon (back contact). Further, contacts known as silver rear contacts, made out of silver or silver-aluminum paste are printed and fired on the N-side of silicon to enable soldering of tabs that electrically connect one cell to the next in a solar cell module. These contacts are the electrical outlets from the PN junction to the outside load. For thin film solar cell assemblies the active elements can be based on other semiconductors such as amorphous silicon, cadmium tellurides, or copper indium gallium selenides. N-type solar cells are also contemplated.

Although a typical silicon solar cell constructed on P-type Si base wafer is described as an example here, different variations in crystalline silicon solar cells such as back contact cells; amorphous silicon solar cells; different variations of organic photovoltaic cells; different thin film solar cells such as CdTe, CIGS are envisioned here as active layers. Similarly electrochromic materials systems are also envisioned here as active layers.

Details about glasses and active layers of the invention may be found in one or more of the following United States patent applications, all of which are commonly owned, and all of which are incorporated herein by reference: Ser. Nos. 10/864,304; 10/988,208; 11/131,919; 11/145,538; 11/384,838; 11/774,632; 11/846,552; 12/097,823; 12/298,956; 12/573,209; 61/324,356; 61/328,258; 61/366,568; and 61/366,578. Additionally, in general useful substrate glasses include soda lime silicate glasses, alkali-alkaline earth-boro-alumino-silicate glasses, or boro-aluminosilicate glasses, generally having silica at 50-80 wt %. Generally, the thermal expansion of such glasses can be from 30-100×$10^{-7}$/° C. Exemplary compositions in wt % include: $SiO_2$ 50-75 wt %; $R_2O_3$ such as $Al_2O_3$ or $B_2O_3$: 2-20 wt %; RO such as CaO, MgO: 5-29 wt %; $R_2O$ such as $Li_2O$, $Na_2O$ and $K_2O$: 0.05-51 wt %.

An embodiment of the invention is a method of forming a photovoltaic device comprising two inorganic substrates comprising the steps of: (a) applying a sealant to at least one of the substrates; (b) aligning the substrates together; and (c) directing a concentrated energy source at the sealant so as to form a seal between at least a portion of the two substrates.

Another embodiment of the invention is a sealant material system for use in joining two or more inorganic substrates that are used to form a hermetic seal protecting an electronic active layer, said sealant material system comprising a solder composition.

Still another embodiment of the invention is a sealant material system for use in joining two or more inorganic substrates contained in a photovoltaic device upon application of a concentrated energy source.

Each numerical range disclosed herein that is bounded by zero, has, as an alternative embodiment, a lower bound of 0.1% instead of zero. The term "comprising" provides support for "consisting essentially of" and "consisting of." It is envisioned that an individual numerical value for a parameter, temperature, weight, percentage, etc., disclosed herein in any form, such as presented in a table, provides support for the use of such value as the endpoint of a range. A range may be bounded by two such values. In a single embodiment, more than one glass composition can be used, and compositions comprising amounts from different columns among the tables are also envisioned.

All ranges disclosed herein are to be understood to encompass the beginning and ending range values and any and all subranges therein. For example, a stated range of "1 to 10" should be considered to include any and all subranges between (and inclusive of) the minimum value of 1 and the maximum value of 10; that is, all subranges beginning with a minimum value of 1 or more and ending With a maximum value of 10 or less, e.g., 1.0 to 2.7, 3.3 to 8.9, 5.7 to 10, etc. A limitation such as "at least one selected from the group consisting of" is intended to provide support for "at least two," "at least three," and so forth up to and including an embodiment including all elements in such a list.

The invention claimed is:

1. A method of hermetically sealing an active layer, comprising
   a. forming on a first substrate an integral preformed edge,
   b. positioning on the first substrate an active layer,
   c. positioning a second substrate in close contact with the active layer, leaving a gap between preformed edge and an edge of the active layer,
   d. adding a seal material to the gap, and
   e. applying an energy source to heat and flow the seal material to fully fill the gap thereby forming a seal therein, and
   f. applying the first substrate material to the top substrate and firing the material to sinter it, thereby forming an integral preformed edge.

2. A method of hermetically sealing an active layer, comprising
   a. forming on a first substrate an integral preformed edge,
   b. positioning on the first substrate an active layer,
   c. positioning a second substrate in close contact with the active layer, leaving a gap between preformed edge and an edge of the active layer,
   d. adding a seal material to the gap, and
   e. applying an energy source to heat and flow the seal material to fully fill the gap thereby forming a seal therein,
   wherein the preformed edge and first substrate are formed by cutting and shaping a block of substrate material to become preformed edge integral with the top substrate, and
   wherein the firing is undertaken during a tempering cycle.

3. The method of claim 1 wherein the active layer is selected from the group consisting of solar cell, solar cell contact, organic PV device, plasma display devices, nanocrystal display, electrochromic device, electrochromic material system, suspended particle device, micro-blind, liquid crystal device, smart window, switchable window, smart glass, eglass, LED, SED, FED, OLED, LCD, DLP, FLD, IMOD, TDEL, QDLED, TMOS, TPD, LCL, LPD, or OLET.

4. A method of hermetically sealing an active layer, comprising
   a. forming on a first substrate an integral preformed edge,
   b. positioning on the first substrate an active layer,
   c. positioning a second substrate in close contact with the active layer, leaving a gap between preformed edge and an edge of the active layer,
   d. adding a seal material to the gap, and
   e. applying an energy source to heat and flow the seal material to fully fill the gap thereby forming a seal therein,
   wherein the seal material is a solder material comprising a metal selected from the group consisting of Pb, Sn, Bi, In, Ag, Zn, Sb, Cu and combinations thereof.

5. A method of hermetically sealing an active layer, comprising
   a. forming on a first substrate an integral preformed edge,
   b. positioning on the first substrate an active layer,
   c. positioning a second substrate in close contact with the active layer, leaving a gap between preformed edge and an edge of the active layer,
   d. adding a seal material to the gap, and
   e. applying an energy source to heat and flow the seal material to fully fill the gap thereby forming a seal therein,
   wherein the seal material is a lead-free solder comprising metals selected from the group consisting of Sn—Ag, Sn—Ag—Bi, Sn—Ag—Cu, Sn—Cu, Sn—Ag—Cu—Sb, Sn—Bi, and Sn—Zn—Bi.

6. The method of claim 5, wherein the solder further comprises an element selected from the group consisting of Ti, Zr, V, Nb, Hf, and combinations thereof.

7. The method of claim 1, wherein the substrates may be the same or different, and are selected from the group consisting of glass, coated glass, ceramic, or metal.

8. A method of hermetically sealing an active layer, comprising
   a. forming on a first substrate an integral preformed edge,
   b. positioning on the first substrate an active layer,
   c. positioning a second substrate in close contact with the active layer, leaving a gap between preformed edge and an edge of the active layer,
   d. adding a seal material to the gap, and
   e. applying an energy source to heat and flow the seal material to fully fill the gap thereby forming a seal therein,
   wherein the substrates are coated with at least one selected from the group consisting of indium tin oxide, aluminum doped zinc oxide, metals, metallic oxides, antireflective coatings, $SiN_X$ coatings, $Si_3N_4$ coatings, and combinations thereof.

9. The method of claim 8, wherein the substrates are coated by a procedure selected from the group consisting of sputtering, CVD, reduction from metallic salts and combinations thereof.

10. The method of claim 1, further comprising after (b) and before (c), (b1) laminating a polymer film to at least one of the active layer, the first substrate and a second substrate.

11. The method of claim 1, wherein at least one substrate is glass.

12. The method of claim 1, wherein the energy source is localized and selected from the group consisting of ultrasound, visible light, ultraviolet light, broadband infrared, laser, induction, and combinations thereof.

13. The method of claim 1, wherein the energy source is dispersed, and selected from the group consisting of thermal heating, magnetic induction heating, convection furnace, and eddy currents.

14. The method of claim 1, wherein the preformed edge and first substrate are formed by cutting and shaping a block of substrate material to become preformed edge integral with the top substrate.

15. The method of claim 4, further comprising after (b) and before (c), (b1) laminating a polymer film to at least one of the active layer, the first substrate and a second substrate.

16. The method of claim 4, wherein at least one substrate is glass.

17. The method of claim 4, wherein the energy source is localized and selected from the group consisting of ultrasound, visible light, ultraviolet light, broadband infrared, laser, induction, and combinations thereof.

18. The method of claim 4, wherein the energy source is dispersed, and selected from the group consisting of thermal heating, magnetic induction heating, convection furnace, and eddy currents.

19. The method of claim 4, wherein the preformed edge and first substrate are formed by cutting and shaping a block of substrate material to become preformed edge integral with the top substrate.

* * * * *